United States Patent
Dart et al.

(10) Patent No.: US 7,734,955 B2
(45) Date of Patent: *Jun. 8, 2010

(54) MONITORING VRM-INDUCED MEMORY ERRORS

(75) Inventors: Charles R. Dart, Austin, TX (US); Edmund Sutherland Gamble, Austin, TX (US); Gary Anthony Jansma, Cedar Park, TX (US); Terence Rodrigues, Austin, TX (US); Robert Joseph Ruckriegel, Round Rock, TX (US); Bruce James Wilkie, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/246,748

(22) Filed: Oct. 7, 2008

(65) Prior Publication Data

US 2009/0031168 A1    Jan. 29, 2009

Related U.S. Application Data

(63) Continuation of application No. 11/690,200, filed on Mar. 23, 2007, now Pat. No. 7,461,303, which is a continuation of application No. 10/872,099, filed on Jun. 18, 2004, now Pat. No. 7,269,764.

(51) Int. Cl.
  *G06F 11/00* (2006.01)
(52) U.S. Cl. ............... 714/22; 714/5; 714/6; 714/13; 714/14; 714/47; 714/708; 361/90; 361/111; 327/20

(58) Field of Classification Search ............... 714/5, 714/6, 13, 14, 22, 47, 54, 708; 340/659–663; 327/20; 361/90, 90.3, 111

See application file for complete search history.

(56) References Cited

U.S. PATENT DOCUMENTS

| | | | | |
|---|---|---|---|---|
| 4,428,020 A * | 1/1984 | Blanchard, Jr. | ............... | 361/90 |
| 5,382,839 A * | 1/1995 | Shinohara | ............... | 327/545 |
| 5,648,759 A * | 7/1997 | Miller et al. | ............... | 340/660 |
| 6,038,633 A * | 3/2000 | Tavallaei | ............... | 710/262 |
| 6,191,499 B1 * | 2/2001 | Severson et al. | ............... | 307/31 |
| 6,316,988 B1 * | 11/2001 | Forehand et al. | ............... | 327/538 |
| 7,093,143 B2 * | 8/2006 | Ito et al. | ............... | 713/300 |
| 7,110,226 B2 * | 9/2006 | Inoue et al. | ............... | 361/18 |
| 2003/0099145 A1 * | 5/2003 | Clark | ............... | 365/226 |

\* cited by examiner

*Primary Examiner*—Robert Beausoliel
*Assistant Examiner*—Charles Ehne
(74) *Attorney, Agent, or Firm*—Cynthia Seal; Law Office of Jim Boice

(57) ABSTRACT

A method and system for improving Field Replacement Unit (FRU) isolation in memory sub-systems by monitoring Voltage Regulator Module (VRM) induced memory errors. A comparator compares the output voltage coming from the VRM to memory. If the comparator detects a VRM output voltage transient that is outside a rated threshold, then a counter is increased by one. If the counter exceeds a count threshold, a VRM error is posted. If a memory failure occurs within a predetermined period of time, then the VRM error pinpoints the VRM output voltage transient as being the likely cause of the memory failure.

9 Claims, 3 Drawing Sheets

MONITORING VRM-INDUCED MEMORY ERRORS

RELATED PATENT APPLICATIONS

The present application is a continuation of U.S. patent application Ser. No. 11/690,200, filed on Mar. 23, 2007, now U.S. Pat. No. 7,461,303 titled "Monitoring VRM-Induced Memory Errors," which is a continuation of U.S. patent Ser. No. 10/872,099 filed Jun. 18, 2004, now U.S. Pat. No. 7,269,764, titled "Monitoring VRM-Induced Memory Errors," issued on Sep. 11, 2007; the contents of which are incorporated herein by reference.

BACKGROUND OF THE INVENTION

1. Technical Field

The present invention relates in general to the field of computers, and in particular to memory systems in computers. Still more particularly, the present invention relates to a method and system for capturing and counting transient voltage excursions in a Voltage Regulator Module (VRM) power supply to identify and isolate the cause of a fatal error in memory powered by the VRM.

2. Description of the Related Art

The complexity of high-speed memory board designs often means that system memory problems encountered in the field or at a customer site often cannot be easily or economically resolved on-site. A typical strategy employed by the Customer Engineer (CE) is to replace a complex and expensive Field Replaceable Unit (FRU) board in an attempt to solve the problem. The FRU board is typically a board that contains many smaller FRU components. The FRU board easily plugs into a backplane in the computer, and the FRU components plug into sockets on the FRU board.

Replacing the entire FRU board is usually overkill, since often only a single FRU component on the FRU board is defective. Still, technicians will replace the entire FRU board anyway because field diagnostic tests are often impractical.

A common problem affecting computer systems in the field is that involving a failure in the system memory. While hardware techniques such as the use of Error Correction Code (ECC) can correct many memory related errors, fatal (uncorrectable) memory errors can still occur. For example, a fatal memory error can occur if voltage reflections produce poor signal quality on a line, or if there is poor mating between connectors on the FRU board, such as between a memory module and a socket.

Another hardware failure that could cause a fatal memory error is a transient Voltage Regulator Module (VRM) failure. A VRM is used to regulate the power supplied to memory modules, such as dual in-line memory modules (DIMM's), single in-line memory modules (SIMM's), and other forms of dynamic random access memory (DRAM) chips. Occasionally, a VRM will momentarily produce a voltage to the memory module(s) that is beyond (higher or lower than) the range that is acceptable to the memory components. During the period that such a deviation (i.e., "excursion") from the allowable range occurs, the operation of the memory module may be disrupted, and it may be unable to receive or send back the correct data, thus resulting in a fatal (non-correctable) memory error.

There are many possible reasons for such an excursion of the VRM's output voltage (or current). For example, there may be a manufacturing or design defect in the VRM. Alternatively, the VRM selected may be inadequately sized for the task, since VRM selection is typically done during the design phase when insufficient information is available about the power requirements for as yet undetermined DIMM modules. The current needed by a DIMM may also be higher than anticipated due to unforeseen applications being run, bus width, signaling technology, input capacitance of the DRAM's, etc. The failure can therefore be either from a defect in the VRM itself, a mis-sizing of the VRM for present conditions, or some other condition that causes the output voltage of the VRM to stray from its desired operating value.

As described above, an unexpected momentary voltage or current excursion of the output of the VRM beyond the expected design limits can result in a failure in the memory module at some later point in time. The failure may be incorrect storage of data, or the failure may be garbled read data, with either failure caused by the voltage excursion. However, since the excursion is transient, it is nearly impossible to identify it as being the cause of the memory module's failure. Furthermore, very often only multiple excursions produce a fatal error in the memory module(s).

What is needed, therefore, is a method and system for capturing and counting transient voltage excursions from the VRM which fall outside the desired operating range of the VRM, and correlating these voltage excursions in time to when a memory occurs, in order to provide the CE with the necessary diagnostic information about which FRU component needs to be replaced (i.e., the VRM, the DIMM, etc.) when repairing a failed memory subsystem.

SUMMARY OF THE INVENTION

Therefore, the present invention is directed to a method and system for improving Field Replacement Unit (FRU) isolation in memory sub-systems by monitoring Voltage Regulator Module (VRM) induced memory errors. A comparator compares the output voltage coming from the VRM supplying the memory to known design thresholds. If the comparator detects a VRM output voltage transient that is outside a rated threshold, then a counter is increased by one. If the counter exceeds a count threshold, a VRM error is posted. If a memory failure occurs within a predetermined period of time, then the VRM error pinpoints the VRM output voltage transient as being the likely cause of the memory failure.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF A PREFERRED EMBODIMENT

Figure 1:
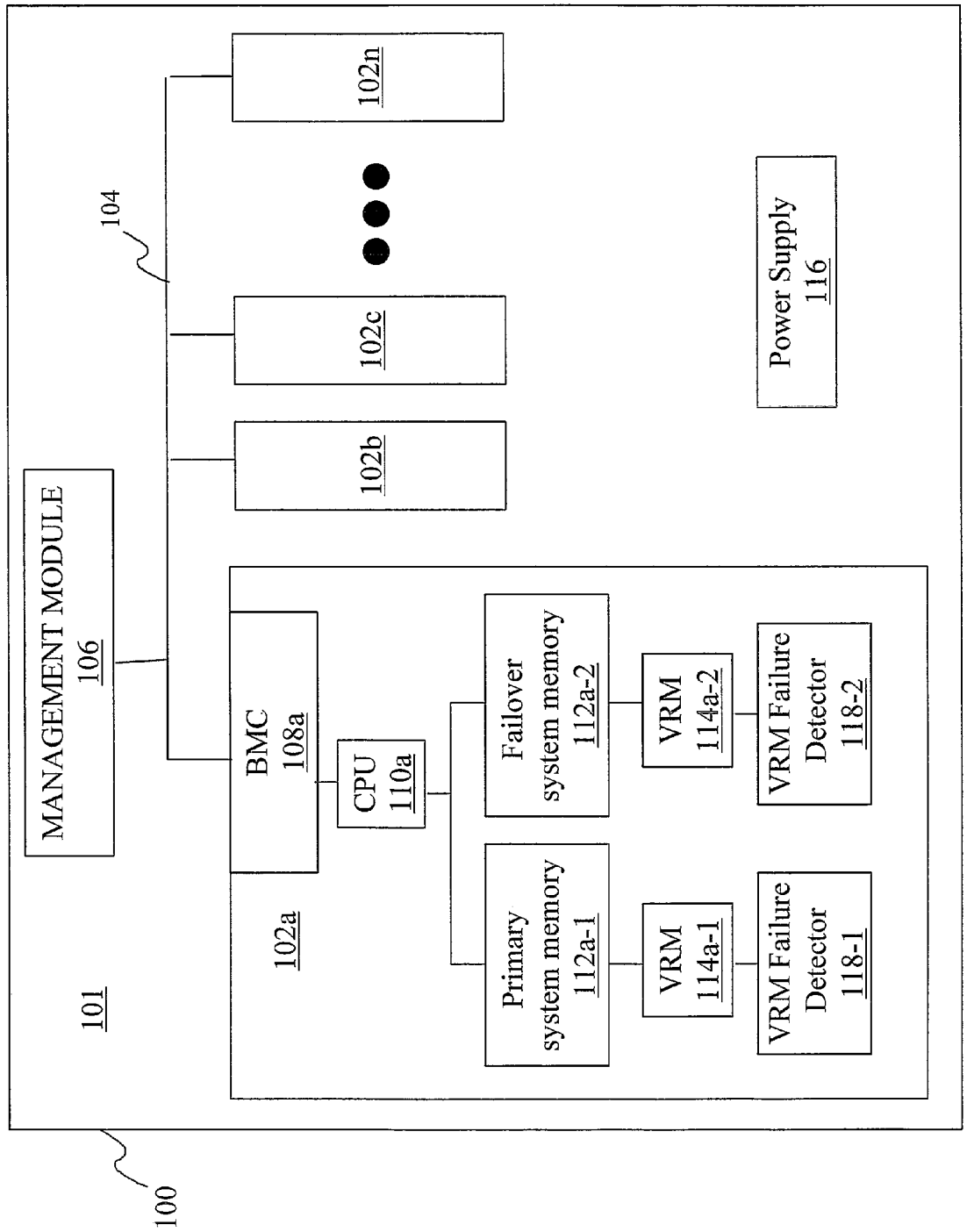
FIG. 1 depicts a diagram of a server blade chassis using a Voltage Regulator Module (VRM) Detector circuit.

While the present invention is useful in any computing system having replaceable components that are sensitive to supply voltage levels, for the purpose of illustration, a server, and particularly a blade server, is used to show an exemplary computing system in which the present invention may be implemented. With reference then to FIG. 1, there is depicted a server blade computer 100. Server blade computer 100 offers high-density server boards (blades 102) in a single server blade chassis (blade center chassis 101). Server blade chassis 101 includes multiple hot-swappable server blades 102a-n connected on a midplane 104. Midplane 104 is a backplane, mounted in the middle of server blade chassis 101, that contains circuitry and sockets into which additional electronic devices or cards, including server blades 102, can be plugged.

There are typically fourteen server blades 102 in server blade chassis 101. The operations of server blades 102 are coordinated by logic identified as management module 106, which includes a processor (not shown) for controlling input/output (I/O) functions, interfacing with networks (such as the Internet or a Local Area Network), and allocating jobs and data to the different server blades 102.

Each server blade 102 includes a Baseboard Management Controller (BMC) 108, which provides an interface between the server blade 102 and the midplane 104. Coupled to the BMC 108 is a Central Processing Unit (CPU) 110, which is preferably multiple processors in a same partition. Coupled to CPU 110 is a primary system memory 112-1 and a backup failover system memory 112-2, each of which may be a DIMM, SIMM, or any similar volatile memory used by the system. Coupled to the system memories 112-1 and 112-2 are Voltage Regulator Modules (VRM) 114a-1 and 114a-2, which control the voltage supplied to system memories 112-1 and 112-2 by a power supply 116. In an alternate embodiment, a single VRM 114 may be coupled to both system memories 112-1 and 112-2. For purposes of clarity, only components for server blade 102a are shown, each labeled with an "a" suffix. It is understood that each of the server blades 102 have similar components as those shown for server blade 102a.

Within each server blade 102, and coupled to each VRM 114, is a VRM failure detector 118. In an alternate embodiment, a single VRM failure detector 118 may be coupled to multiple VRMs 114 (e.g., a single VRM failure detector 118 may be connected to both VRM 114a-1 and 114a-2). In another alternate embodiment, one or more VRM failure detectors 118 may be coupled to VRM's 114 in one or more server blades 102. For example, a single VRM failure detector 118 may be coupled to all VRM's 114 in all of the server blades 102, assuming of course that all of the VRM's 114 have the same nominal output voltages.

Figure 2:
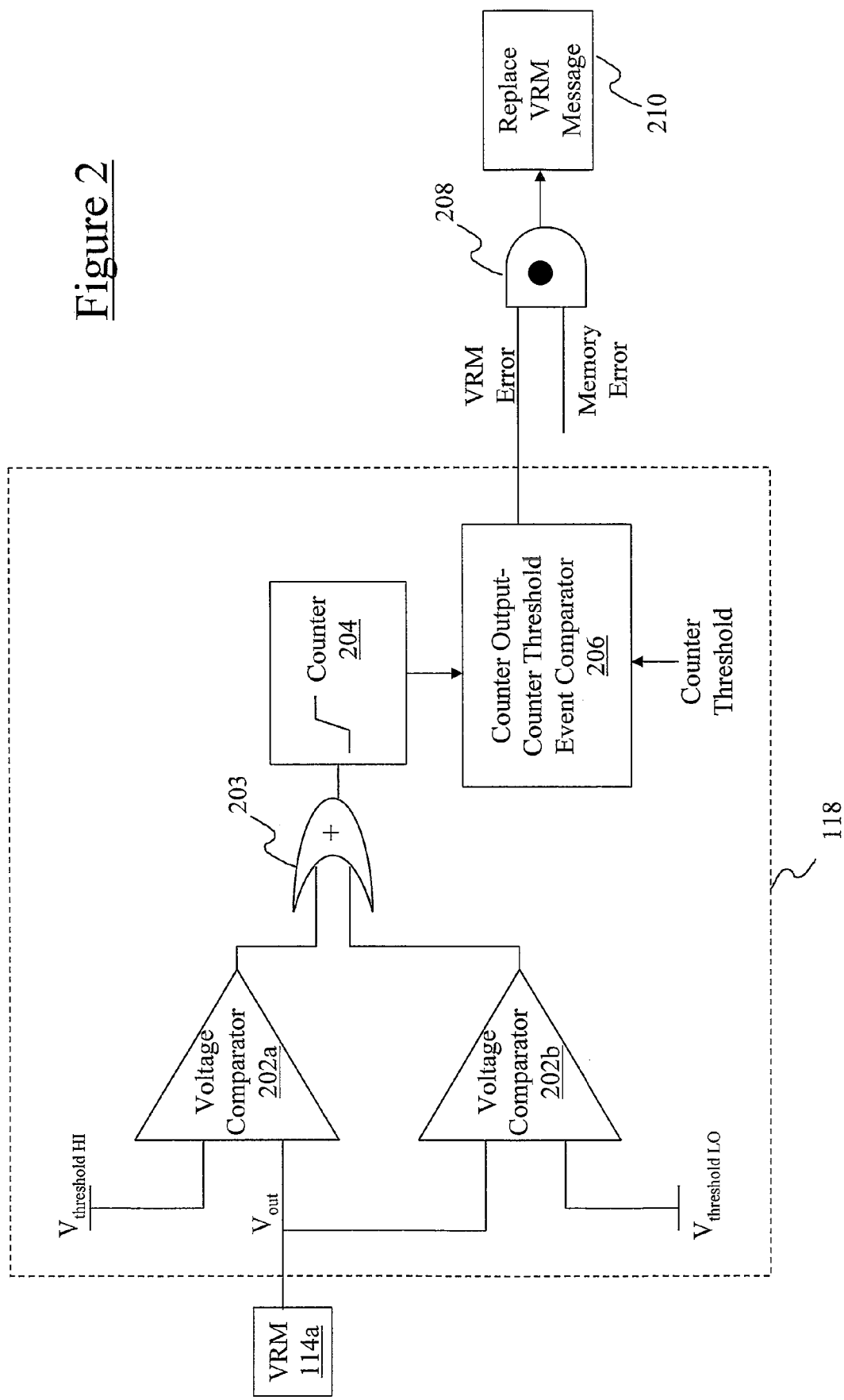
FIG. 2 illustrates detail of the VRM Detector circuit.

With reference now to FIG. 2, additional detail of VRM failure detector 118 is provided. The voltage $V_{out}$ being supplied to system memories 112 is also input into a first input of a voltage comparator 202a and voltage comparator 202b. A second input to voltage comparator 202a receives a steady voltage $V_{threshold\ HI}$, which is the maximum operational voltage that should be output from VRM 114. A second input to voltage comparator 202b receives a steady voltage $V_{threshold\ LO}$, which is the minimum operational voltage that should be output from VRM 114. Each voltage comparator 202 produces an output only if the first input $V_{out}$ from VRM 114 is higher (voltage comparator 202a) or lower (voltage comparator 202b) than the threshold voltage. Thus, voltage comparator 202a only outputs an assertion signal when $V_{out}$ is greater than $V_{threshold\ HI}$, and voltage comparator 202b only outputs an assertion signal when $V_{out}$ is less than $V_{threshold\ LO}$.

Note then that $V_{threshold\ HI}$ and $V_{threshold\ LO}$ are preferably chosen to be the boundaries of the operational output voltage of the VRM. Alternatively, $V_{threshold\ HI}$ and $V_{threshold\ LO}$ are a +/−percentage of the boundary of the operational output voltage of the VRM.

Note also that in an alternate embodiment, only a single voltage comparator 202 may be used, measuring either a VRM output excursion above $V_{threshold\ HI}$ or a VRM output excursion below $V_{threshold\ LO}$.

The outputs from voltage comparators 202a and 202b are input into an OR gate 203. Thus, when $V_{out}$ either exceeds $V_{threshold\ HI}$ or drops below $V_{threshold\ LO}$, then OR gate 203 will output an assertion signal wave.

As depicted, the output from OR gate 203 is input into a counter 204, which counts the occurrences of $V_{out}$ being greater than $V_{threshold\ HI}$ or less than $V_{threshold\ LO}$. This count is then input into an event comparator 206, which compares the count from counter 204 to a counter threshold value. That is, event comparator 206 determines if the number of occurrences, in which $V_{out}$ is greater than $V_{threshold\ HI}$ or less than $V_{threshold\ LO}$, exceeds a pre-determined threshold of such events. This threshold may be set to one, or the threshold may be set to more than one. In either case, when the threshold is reached, then a VRM error signal is input into a combination logic such as an AND gate 208. Also input into AND gate 208 is a signal indicative of a fatal memory error in one or both system memories 112. When AND gate 208 receives both the VRM error and memory error, a signal is output creating a message 210, indicating that the VRM needs to be replaced. Message 210 may be stored locally, such as in failover system memory 112-2, or it may be sent to a remote storage location, including a local non-volatile memory such as a hard disk drive or a remote manager. Note that AND gate 208, like counter 204, event comparator 206, and other components of VRM failure detector 118 may be physical hardware devices, or may be software that performs the same function as the physical device in a manner known to those skilled in the art of computer architecture.

Figure 3:
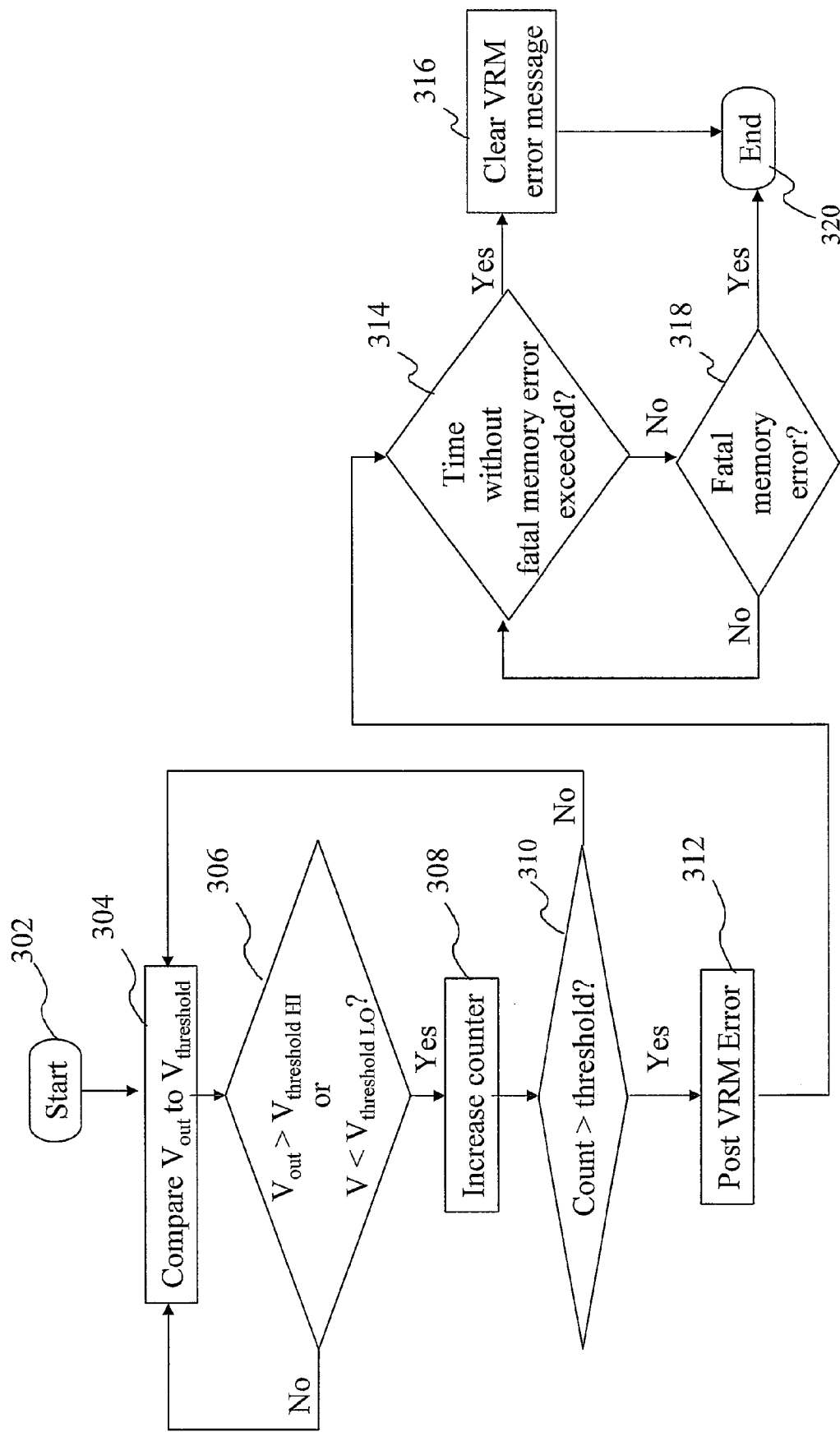
FIG. 3 is a flow-chart of steps taken according to the present invention to capture transient VRM failure event(s) that caused a fatal memory error.

With reference now to FIG. 3, a flow chart is illustrated showing preferred steps used in the present invention for showing that a transient excursion by the VRM resulted in a fatal memory error. After initiator block 302, the first step in the method is to compare $V_{out}$ from the VRM to the pre-determined $V_{threshold}$ ($V_{threshold\ HI}$ and $V_{threshold\ LO}$) for VRM. If the threshold is exceeded (query block 306), by a combination of excursions in which the output of the VRM is either too high ($V_{out} > V_{threshold\ HI}$) or too low ($V_{out} > V_{threshold\ LO}$), then a counter is increased by one (block 308). If the contents of the counter exceed a pre-determined threshold, which may be one or may be more than one (block 310), then a VRM error message is posted (block 312).

A determination is then made (query block 314) regarding the amount of time that has elapsed since the error message was posted without a fatal memory error occurring. This determination is significant since it may be the temporal proximity of the VRM error(s) with the memory failure that indicates that the VRM error(s) is the cause of the memory failure. If a pre-determined amount of time is exceeded (such as 15 minutes), then the error message is cleared (block 316), since it can be assumed that the VRM error(s) had no effect on the system memory. However, if a fatal memory occurs within the pre-determined period of time since the posting of the error message (block 318), then the error message is left undisturbed, and the process ends (terminator block 320). The pre-determined amount of time is preferably set by Basic Input/Output System (BIOS) in the blade. Thereafter, when a Customer Engineer (CE) looks at the computer whose primary system memory has failed, the error message will pinpoint the VRM Field Replaceable Unit (FRU) supplying the memory as being the likely cause of the memory failure.

In an alternate embodiment, the determination made in query block 314 can be made independent of when the VRM error occurred. For example, a management system for the computer system housing the VRM may be on a time cycle (e.g., 18 minutes), during which the computer system, including the memory, is monitored. If a memory error is not detected within that 18 minute window, then the VRM error message is cleared, without regard to where within that 18 minute window the VRM error occurred. Thus, if no fatal memory error occurs during that 18 minute window, then the counter is cleared, causing the VRM error to also be cleared. (Of course, "18 minutes" is used for exemplary purposes only, and the time cycle may be any time period determined by a management system for the computer, the operator of the computer, or any other factor determined for the computer system.)

The present invention thus provides a reliable method and system for monitoring VRM's for failure, and storing these failures to aid in the determination of a cause of a memory failure, including those failures resulting in a primary memory failing, thus causing memory function to failover to a backup memory.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternate embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention. For example, while the VRM errors have been used to diagnose the cause of system memory errors, the VRM failure detector 118 can also be used to diagnose the cause of errors in any component, preferably an FRU component, which is sensitive to a supply voltage. Such components include, but are not limited to, non-system memory in a computer, microprocessors, other processor logic, Input/Output (I/O) systems, and peripheral devices, such as (but not limited to) memory sticks.

What is claimed is:

1. A voltage regulator module failure detector, wherein the voltage regulator module failure detector is a hardware device comprising:
   a voltage comparator comprising:
      a first input, the first input receiving an output front a voltage regulator module (VRM) that supplies regulated power to a computer component,
      a second input, the second input receiving a threshold voltage, the threshold voltage being a boundary of an operational output voltage of the VRM, wherein the threshold voltage is a minimum operational output voltage of the VRM, and
      an output, the output transmitting a result of a comparison of the output from the VRM with the threshold voltage, wherein the result is transmitted only when the output from the VRM is outside the threshold voltage;
   a courtier coupled to the output of the voltage comparator, wherein the counter counts the number of times that the output from the VRM is outside the threshold voltage, and wherein the counter is cleared if a failure of the computer component has not occurred after a pre-determined period of time from when the VRM error was posted;
   an event comparator coupled to the counter, the event comparator comparing a count in the counter with a pre-determined event threshold, wherein a VRM error is posted by the event comparator when the count in the counter exceeds the pre-determined event threshold; and
   a combinational logic having a first input of the posted VRM error and a second input of the computer component failure, wherein in response to the posted VRM error and computer component failure both being input contemporaneously into the combinational logic, the combinational logic outputs a message instructing a replacement of the VRM.

2. The voltage regulator module failure detector of claim 1, wherein the threshold voltage is a maximum operational output voltage of the VRM.

3. The voltage regulator module failure detector of claim 1, wherein the threshold voltage is a pre-determined percentage of an operational output voltage of the VRM.

4. The voltage regulator module failure detector of claim 1, wherein the counter is cleared at a pre-determined interval of time that is independent of when a VRM error occurred.

5. The voltage regulator module failure detector of claim 1, wherein the computer component is a memory.

6. The voltage regulator module failure detector of claim 1, wherein the computer component is a microprocessor.

7. A computer system comprising:
   a hardware voltage regulator module failure detector that includes:
   a voltage comparator having:
      a first input, the first input receiving an output from a voltage regulator module (VRM) that supplies regulated power to a computer component,
      a second input, the second input receiving a threshold voltage, the threshold voltage being a boundary of an operational output voltage of the VRM, wherein the threshold voltage is a pre-determined percentage of the operational output voltage of the VRM, and
      an output, the output transmitting a result of a comparison of the output from the VRM with the threshold voltage, wherein the result is transmitted only when the output from the VRM is outside the threshold voltage;
   a counter coupled to the output of the voltage comparator, wherein the counter counts the number of times that the output from the VRM is outside the threshold voltage, and wherein the counter is cleared if a failure of the computer component has not occurred after a pre-determined period of time from when the VRM error was posted;
   an event comparator coupled to the counter, the event comparator comparing a count in the counter with a pre-determined event threshold, wherein a VRM error is posted by the event comparator when the count in the counter exceeds the pre-determined event threshold; and a combinational logic having a first input of the posted VRM error and a second input of the computer component failure, wherein in response to the posted VRM error and computer component failure both being input contemporaneously into the combinational logic, the combinational logic outputs a message instructing a replacement of the VRM.

8. The computer system of claim 7, wherein the threshold voltage is a maximum operational output voltage of the VRM.

9. The computer system of claim 7, wherein the threshold voltage is a minimum operational output voltage of the VRM.

* * * * *